United States Patent
Kawaguchi et al.

(10) Patent No.: US 7,304,319 B2
(45) Date of Patent: Dec. 4, 2007

(54) WAFER CHARGE COMPENSATION DEVICE AND ION IMPLANTATION SYSTEM HAVING THE SAME

(75) Inventors: Hiroshi Kawaguchi, Ehime (JP); Makoto Sano, Ehime (JP); Michiro Sugitani, Ehime (JP); Junichi Murakami, Ehime (JP); Mitsukuni Tsukihara, Ehime (JP); Mitsuaki Kabasawa, Ehime (JP); Takashi Kuroda, Ehime (JP); Kazunari Ueda, Ehime (JP); Hiroshi Sogabe, Ehime (JP)

(73) Assignee: Sen Corporation, An Shi and Axcelis Company, Tokyo (JP)

( * ) Notice: Subject to any disclaimer, the term of this patent is extended or adjusted under 35 U.S.C. 154(b) by 194 days.

(21) Appl. No.: 11/151,308

(22) Filed: Jun. 14, 2005

(65) Prior Publication Data

US 2006/0113492 A1    Jun. 1, 2006

(30) Foreign Application Priority Data

Nov. 30, 2004    (JP) ............................. 2004-345230

(51) Int. Cl.
*H01J 37/317* (2006.01)
(52) U.S. Cl. ................. 250/492.21; 250/251

(58) Field of Classification Search ........... 250/492.21, 250/251
See application file for complete search history.

(56) References Cited

U.S. PATENT DOCUMENTS

| 5,668,368 | A  | * | 9/1997 | Sakai et al. ................ 250/251 |
| 6,313,428 | B1 | * | 11/2001 | Chen et al. ............ 219/121.43 |
| 6,753,539 | B2 | * | 6/2004 | Kawaguchi ............ 250/492.21 |
| 2006/0113491 | A1 | * | 6/2006 | Kawaguchi et al. ... 250/492.21 |

* cited by examiner

*Primary Examiner*—Kiet T. Nguyen
(74) *Attorney, Agent, or Firm*—Arent Fox LLP

(57) ABSTRACT

A charge compensation device according to this invention is for suppressing charging of a wafer when the wafer is irradiated with a beam from a beam generation source unit. The charge compensation device comprises at least one first arc chamber having at least one first extraction hole and a second arc chamber having at least one second extraction hole faced on the reciprocal swinging beam of the predetermined scan range. A first arc voltage is applied to the first arc chamber to generate first plasma in the first arc chamber. The generated first plasma is extracted from the first arc chamber and introduced into the second arc chamber. Second plasma is produced in the second arc chamber, and second extracted plasma from the second arc chamber forms a plasma bridge between the second extraction hole and the reciprocal swinging beam.

18 Claims, 5 Drawing Sheets

WAFER CHARGE COMPENSATION DEVICE AND ION IMPLANTATION SYSTEM HAVING THE SAME

This application claims priority to prior application JP 2004-345230, the disclosure of which is incorporated herein by reference.

BACKGROUND OF THE INVENTION

This invention relates to an ion implantation system having an angular energy filter that deflects an ion beam by the use of at least one of an electric field and a magnetic field and further relates to a wafer charge compensation device suitable for application thereto.

An ion implantation system is widely used in the process of manufacturing semiconductor integrated circuits because of its capability of introducing impurities into fine regions of a surface of a processing object with high accuracy. In the ion implantation system, since ions having charges are implanted into a wafer as a processing object, the storage of charge (charge-up) onto the wafer becomes a problem. In addition, there also arises a problem of divergence of an ion beam due to space-charge produced in a beam line.

Since the ions that are implanted normally have positive charges, negative charges (electrons) are supplied for defusing the charge-up and suppressing the ion beam divergence. As an example thereof, there is a method of positively supplying electrons produced by collision of the ions with walls of the beam line. Alternatively, there is a method of producing secondary electrons by the use of an electron gun near the wafer and supplying them. Among various methods like these, use is widely made of a plasma shower (or plasma flood gun) as a method that can supply relatively low-energy electrons.

In a batch ion implantation system, wafers are mounted on a rotary disk capable of a linear reciprocating motion to thereby enable ion implantation over the whole surface of each wafer. In this event, a trajectory of an ion beam is fixed with respect to a beam line. A plasma shower is provided near the trajectory of the ion beam so that electrons are extracted from the plasma shower by the potential of the ion beam.

FIG. 1 is an exemplary diagram of a conventional plasma shower used in a batch ion implantation system for defusing the charge-up.

In FIG. 1, a plasma forming gas 216 is introduced into an arc chamber 215. Plasma is formed by heating a filament 217 using the power from a power supply 218 while applying an arc voltage 219 across the arc chamber 215 and the filament 217. By configuring that an ion beam 228 is located near the arc chamber 215, electrons are extracted due to the potential generated by the ion beam 228 so that the charge-up caused by the ion beam 228 is suppressed. It is assumed that the ion beam 228 is advancing from the front side toward the back side of the sheet of FIG. 1. Feeding of electrons from the arc chamber 215 to the ion beam 228 can be facilitated by disposing a shower tube 237 so as to surround the ion beam 228 and applying a potential 238 to the shower tube 237.

On the other hand, in an ion implantation system having a deflection mechanism for scanning the wafer that carries out beam deflecting for scanning by providing a linear reciprocating motion of an ion beam itself, the relative position between the ion beam and a plasma shower constantly changes and therefore a stable supply of electrons is difficult. In view of this, there are proposed various methods for supplying electrons extracted from a plasma shower to an ion beam that is deflected for scanning.

As an example, there is proposed a method of applying a magnetic field over a deflecting area of an ion beam, of which the trajectory changes in a wide range, in order to facilitate feeding of electrons to the ion beam in an ion beam charge compensation device (e.g. JP-A-H09-147785). In this method, a plasma arc chamber is disposed at the center of the beam deflecting area so as to be perpendicular to the beam and the magnetic field spreading from the center of the plasma arc chamber over the whole beam deflecting area is generated by a coil.

However, in the method of spreading the electrons extracted from the single portion over the deflecting area of the ion beam by the use of the magnetic field, since a leakage magnetic field exists in a beam line, the ion beam is bent so that distribution and implantation angle of the ion beam are adversely affected.

Further, in a method of disposing a filament in an arc chamber large enough to cover a scan area of an ion beam, there is concern about metal contamination caused by a material (tungsten or the like) of the filament.

SUMMARY OF THE INVENTION

It is an object of this invention to suppress positive charging of a wafer due to ion implantation by the use of a charge compensation device (plasma shower) that can autonomously extract electrons by the potential of an ion beam regardless of a scan position of the ion beam.

A charge compensation device according to this invention is for suppressing charging of a wafer, when the wafer is irradiated with a charged particle beam containing an ion beam extracted from a beam generation source unit onto the wafer while reciprocal scanning by the reciprocal swinging beam over a predetermined scanning range on a beam line. According to an aspect of this invention, the charge compensation device comprises at least one first arc chamber having at least one first extraction hole which opens up in a second arc chamber, and the second arc chamber having at least one second extraction hole faced on the reciprocal swinging beam of the predetermined scan range on the beam line. A first arc voltage is applied to the first arc chamber to produce first plasma in the first arc chamber. The generated first plasma is extracted from the first arc chamber and introduced into the second arc chamber, and second plasma is produced in the second arc chamber again, and second extracted plasma from the second arc chamber forms a plasma bridge between the second extraction hole and the reciprocal swinging beam.

In the charge compensation device, a second arc voltage is supplied between the first arc chamber and the second arc chamber for producing the second plasma in the second arc chamber.

In the charge compensation device, it is preferable that the second extraction hole is in the form of a single slit extending over the predetermined scan range or in the form of a plurality of holes arranged at intervals over the predetermined scan range.

In the charge compensation device, it is preferable that an opening shape or an opening distribution of the second extraction hole corresponds to a plasma density distribution in the second arc chamber such that an opening density becomes high at a portion where the plasma density distribution is low while the opening density becomes low at a portion where the plasma density distribution is high.

In the charge compensation device, it is preferable that, even when a position of the beam changes due to reciprocating scanning by the reciprocal swinging beam, the plasma bridge is constantly formed between the reciprocal swinging beam and the second extraction hole so that an autonomous electron supply is carried out.

In the charge compensation device, it is preferable that the second arc chamber is configured so as not to allow leakage of a gas from other than the second extraction hole.

In the charge compensation device, it is preferable that the second arc chamber is provided with permanent magnets in a region other than regions where the first arc chamber and the second extraction hole are respectively provided, to form confinement magnetic fields, thereby confining the plasma in the second arc chamber to increase plasma uniformity over the predetermined scan range.

In the charge compensation device, it is preferable that a second extraction voltage is supplied to the second arc chamber for efficiently supplying the electrons to the beam.

In the charge compensation device, it is preferable that the second extraction hole and the predetermined scan range thereabout are covered with a hollow cylindrical or rectangular member.

In the charge compensation device, it is preferable that a bias electrode is provided on an upstream side, with respect to an advancing direction of the beam, of the hollow cylindrical or rectangular member to thereby prevent scattering of the electrons in an upstream direction of the hollow cylindrical or rectangular member to efficiently transport the electrons toward the wafer.

In the charge compensation device, it is preferable that a potential of the hollow cylindrical or rectangular member can be set different from that of the second arc chamber.

In the charge compensation device, it is preferable that inner walls of the hollow cylindrical or rectangular member are formed serrated to thereby prevent adhesion of insulating stains to the whole surfaces of the inner walls.

In the charge compensation device, it is preferable that an arc current is measured and fed back so that a control is executed to make constant an amount of plasma electrons in the second arc chamber or the arc current.

In the charge compensation device, it is preferable that a plurality of first arc chambers are arranged at intervals in the predetermined scan range to thereby increase the plasma density in the second arc chamber and improve the plasma uniformity in the second arc chamber.

In the charge compensation device, it is preferable that an extraction electrode is provided between the first arc chamber and the second arc chamber for extracting the electrons from the first arc chamber.

In the charge compensation device, it is preferable that a first extraction voltage is supplied between the extraction electrode and the first arc chamber for extracting the electrodes from the first arc chamber.

In the charge compensation device, it is preferable that the second arc voltage is supplied between the extraction electrode and the second arc chamber for producing the plasma in the second arc chamber.

In the charge compensation device, it is preferable that, at two end surfaces, located in a direction perpendicular to the advancing direction of the beam, of the second arc chamber, a plurality of the permanent magnets, each having a polygonal frame shape or an annular shape, are arranged concentrically for forming the confinement magnetic fields.

An ion implantation system according to this invention comprises a scan mechanism for reciprocal scanning the wafer by the reciprocal swinging charged particle beam containing an ion beam over a predetermined scan range by the use of at least one of an electric field and a magnetic field, and an angular energy filter disposed on a downstream side of the scan mechanism for selecting only an ion species having a necessary energy from the ion beam. According to another aspect of this invention, the charge compensation device mentioned above is disposed on the downstream side of the angular energy filter.

DESCRIPTION OF THE PREFERRED EMBODIMENT

Figure 1:
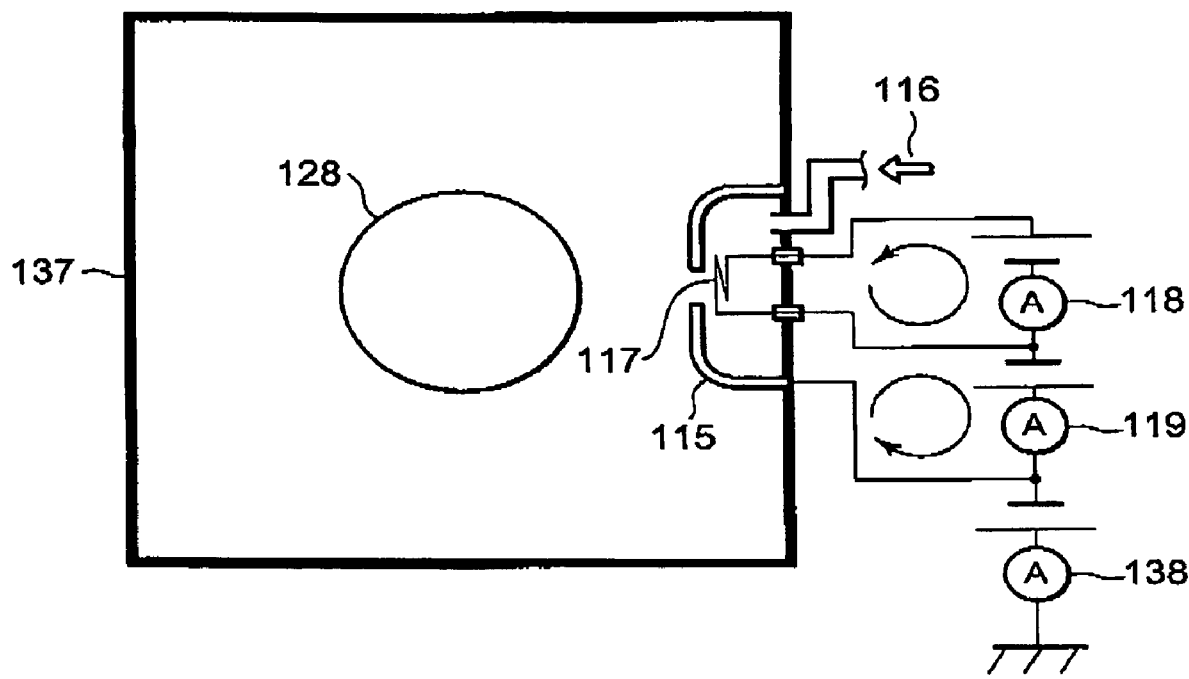
FIG. 1 is an exemplary diagram of a conventional plasma shower used in a batch ion implantation system.
Figure 2A:
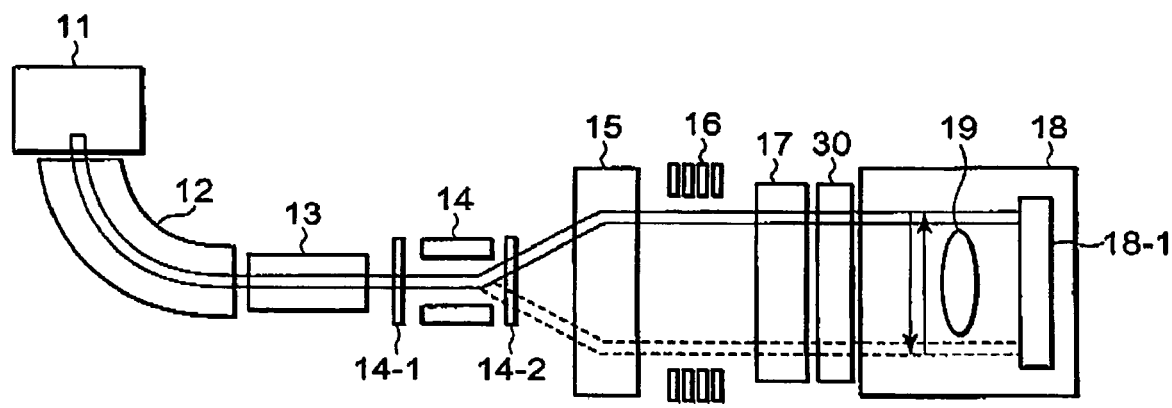
FIGS. 2A and 2B are a plan view and a side view, respectively, showing a schematic structure of an ion implantation system applied with this invention.
Figure 2B:
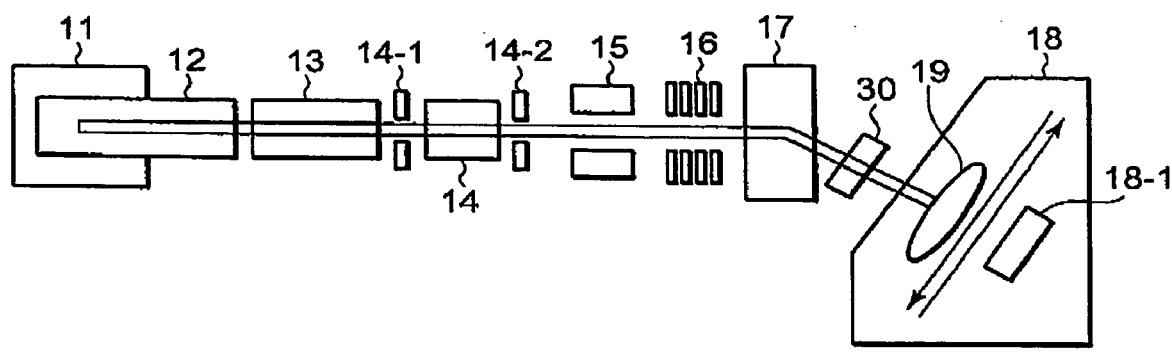

Referring to FIGS. 2A and 2B, description will be first given about an example wherein a wafer charge compensation device according to this invention is employed. In this example, this invention is applied particularly to a single-wafer ion implantation system among beam processing systems each using a charged particle beam. FIGS. 2A and 2B are a plan view and a side view, respectively, showing a schematic structure of the single-wafer ion implantation system.

The illustrated ion implantation system comprises an ion source unit 11 (including ion source and extraction electrode), a mass analysis magnet device 12, a beam shaper 13, a deflector 14 for scanning, a P (Parellelizing)-lens 15, acceleration/deceleration electrodes (A/D columns) 16, an angular energy filter (AEF) 17, and a process chamber 18.

In this ion implantation system, ions generated in the ion source unit 11 are extracted through the extraction electrode (not illustrated) as an ion beam (hereinafter referred to as a "beam"). The extracted beam is subjected to a mass analysis in the mass analysis magnet device 12 so that only a necessary ion species is selected. The beam composed of only the necessary ion species is shaped in cross-section by the beam shaper 13. The beam shaper 13 is formed by a Q (Quadrant or Quadrupole)-lens and so on. The beam having the shaped cross-section is deflected in an upward/downward direction in FIG. 2A by the deflector 14 for scanning. The deflector 14 has at least one shield electrode 14-1 and at least one shield electrode 14-2 that are disposed near the deflector 14 on its upstream and downstream sides, respectively. Although deflection scan electrodes are used as the deflector 14 for scanning in this embodiment, a deflection scan magnet may be used in place of them.

The beam deflected by the deflector 14 for scanning is parallelized by the P-lens 15 formed by electrodes or a magnet so as to be parallel to an axis of a deflection angle of 0°. In FIG. 2A, a scan range by a reciprocal swinging beam by the deflector 14 is indicated by a thick black line and double broken lines. The beam from the P-lens 15 is accelerated or decelerated by one or more acceleration/deceleration electrodes 16 and sent to the angular energy filter 17. The angular energy filter 17 performs an analysis about energy of the beam to thereby select only an ion species having a necessary energy. As shown in FIG. 2B, only the selected ion species is deflected slightly downward in the angular energy filter 17. The beam composed of only the thus selected ion species is implanted into a wafer 19 that is a to-be-irradiated object introduced in the process chamber 18. The beam that is deviated from the wafer 19 is incident on a beam stopper 18-1 provided in the process chamber 18 so that energy thereof is consumed. A transportation path of the beam is all maintained in a high-vacuum state.

In FIG. 2A, arrows shown adjacent to the wafer 19 represent that the beam is deflected for scanning in directions of these arrows, while, in FIG. 2B, arrows shown adjacent to the wafer 19 represent that the wafer 19 is moved in directions of these arrows. Specifically, assuming that the beam is reciprocatingly deflected for scanning in, for example, x-axis directions, the wafer 19 is driven by a drive mechanism (not illustrated) so as to be reciprocated in y-axis directions perpendicular to the x-axis directions. This enables irradiation with the beam over the whole surface of the wafer 19.

In the manner as described above, in the ion implantation system shown in FIGS. 2A and 2B, a beam having an elliptical or oval continuous cross-section that is long in one direction can be obtained by deflection a beam having a circular cross-section or an elliptical or oval cross-section and then bent at a uniform angle at any positions in a scan area thereof by the use of the angular energy filter serving as a later-stage energy analyzer and finally can be implanted into the wafer 19.

A charge compensation device 30 according to this invention is provided on the downstream side of the deflector 14 and, more specifically, on the downstream side of the angular energy filter 17. The charge compensation device is also called a plasma shower. The charge compensation device 30 is located outside the process chamber 18 in FIGS. 2A and 2B but may be disposed inside the process chamber 18.

Figure 3:
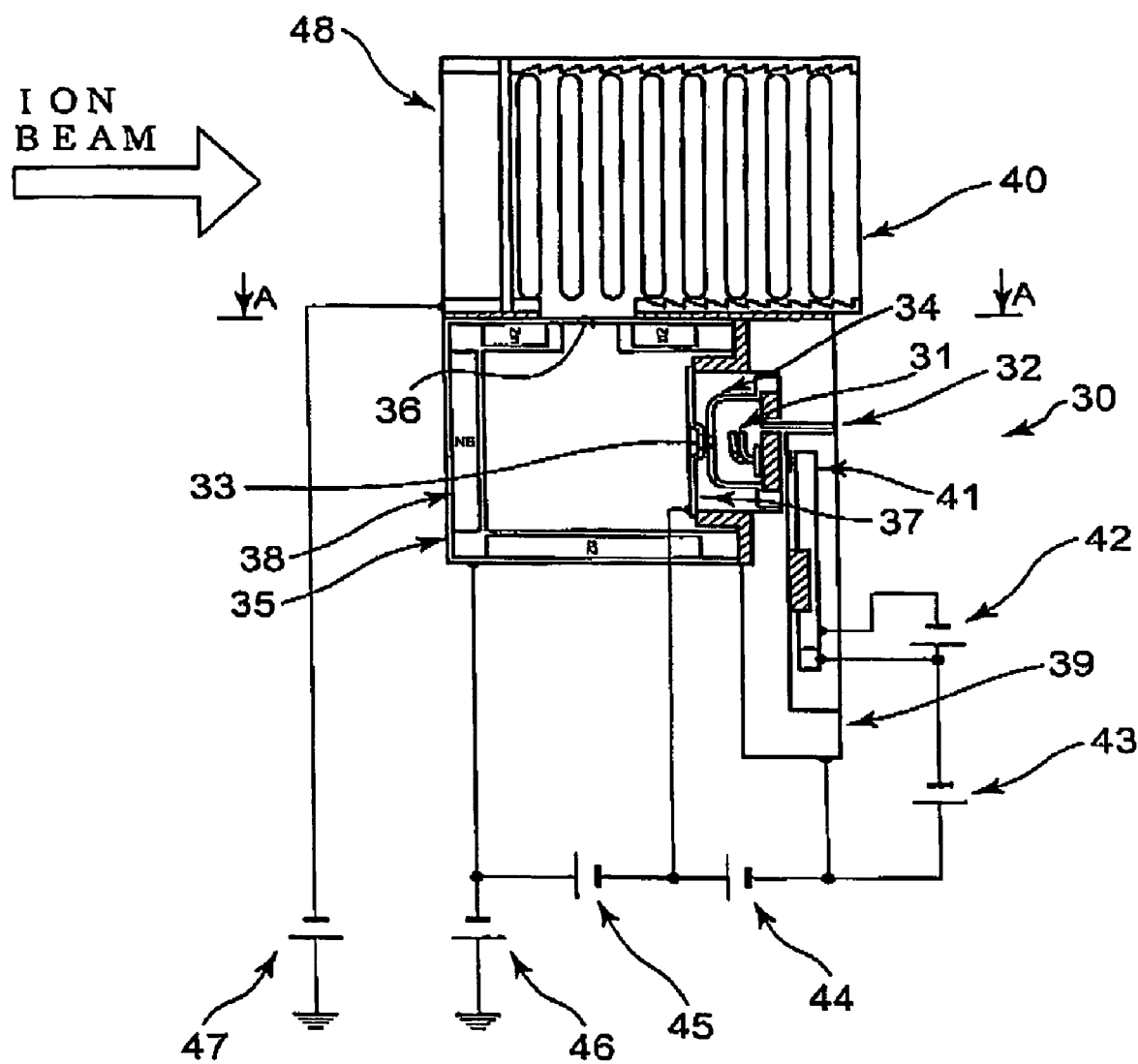
FIG. 3 is a vertical sectional view for explaining a structure of a charge compensation device according to this invention.
Figure 4:
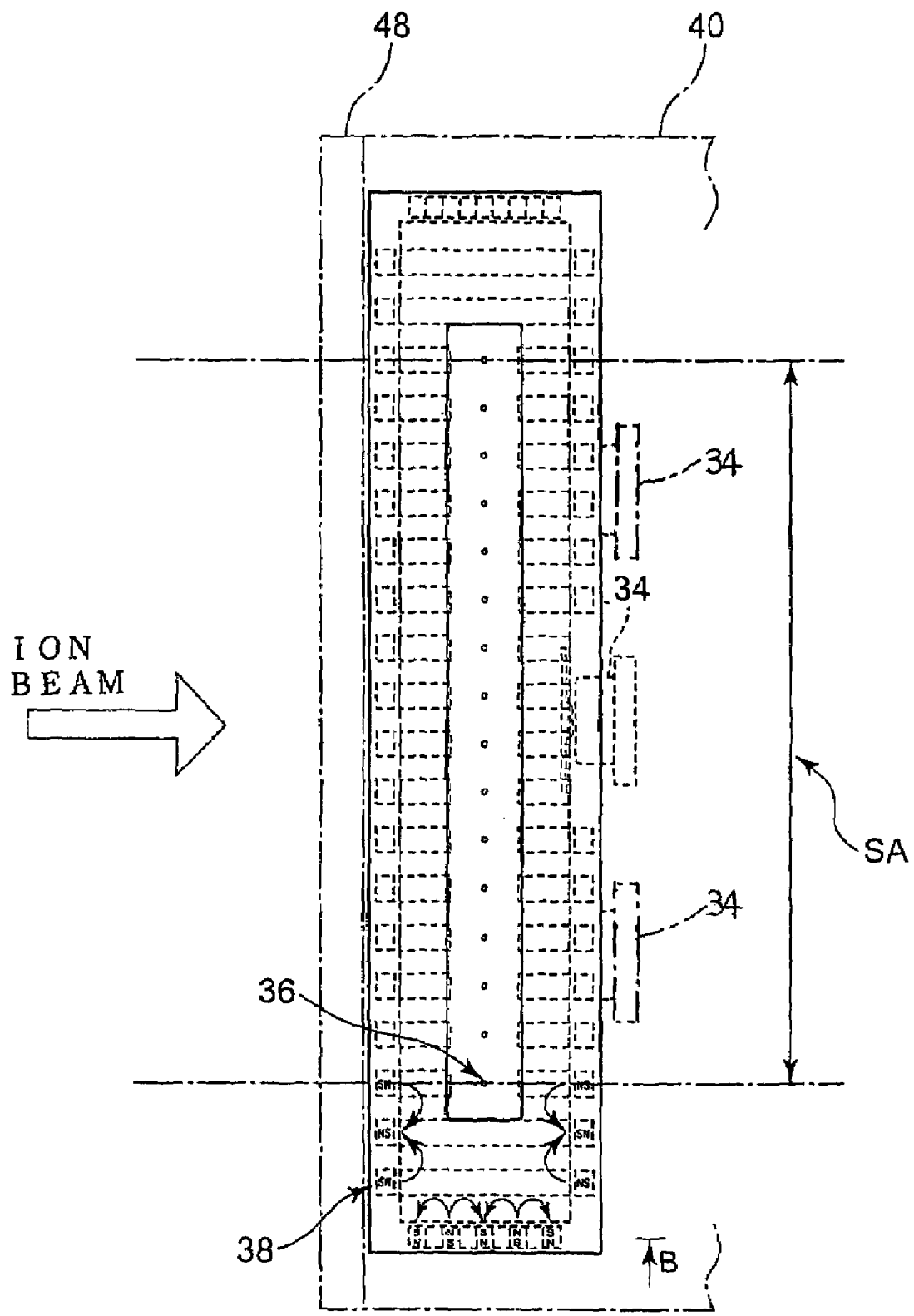
FIG. 4 is a cross-sectional view taken along line A-A in FIG. 3.

Referring to FIGS. 3 and 4, the charge compensation device 30 will be described. The charge compensation device 30 comprises a first arc chamber 34 provided with a filament 31, a gas introduction port 32, and one or more first extraction holes 33, and a second arc chamber 35. The second arc chamber 35 has a second extraction hole 36 and is attached to a tubular or hollow cylindrical or rectangular member (flood box) 40 such that the second extraction hole 36 is exposed to an inner space of the hollow cylindrical or rectangular member 40 and is faced on the reciprocal swinging beam of the scan area. The hollow cylindrical or rectangular member 40 may be part of the process chamber 18 on its inlet side or may be disposed in the process chamber 18. In any event, the second arc chamber 35 has a length approximately extending over the whole width of the hollow cylindrical or rectangular member 40.

In FIG. 4, symbol SA denotes a scan range or area (deflecting range or area) by the beam in the hollow cylindrical or rectangular member 40. In this embodiment, the second extraction hole 36 is realized by a plurality of holes arranged at intervals in a direction of the length of the second arc chamber 35 in the scan area SA.

Alternatively, the second extraction hole 36 may be realized by a single slit extending over the scan area SA. In the case of either the plurality of holes or the single slit, the opening distribution or shape of the second extraction hole 36 is configured to correspond to a second plasma density distribution in the second arc chamber 35. That is, it is desirable that the opening density be high at a portion where the plasma density is low while the opening density be low at a portion where the plasma density is high. Specifically, when the second extraction hole 36 is realized by the plurality of holes, the interval of the holes is shortened at the portion where the plasma density is low while the interval of the holes is increased at the portion where the plasma density is high. On the other hand, when the second extraction hole 36 is realized by the single slit, the width of the slit is increased at the portion where the plasma density is low while the width of the slit is reduced at the portion where the plasma density is high.

The first arc chamber 34 is attached to a wall of the second arc chamber 35 such that the first extraction hole 33 is exposed or opened up to the second arc chamber 35 at a position near an intermediate portion in the length direction of the second arc chamber 35. At a boundary portion between the first and second arc chambers 34 and 35, there is provided a first extraction electrode 37 having a hole at a position corresponding to the first extraction hole 33. However, the first extraction electrode 37 may be omitted. In this case, a second arc voltage, which will be described later, is supplied between the first and second arc chambers 34 and 35 for producing second plasma in the second arc chamber 35.

A plurality of permanent magnets 38 are disposed at wall surfaces of the second arc chamber 35 excluding those regions where the first arc chamber 34 and the second extraction hole 36 are respectively provided. That is, the permanent magnets 38 are arranged at intervals at each of the upper and lower wall surfaces, the left and right wall surfaces, and the both-side end wall surfaces of the second arc chamber 35. The permanent magnets 38 serve to form confinement magnetic fields (cusp magnetic fields for confinement) in the second arc chamber 35. Therefore, all the permanent magnets 38 are disposed with their magnetic poles directed toward the inside of the second arc chamber 35 and with the magnetic poles of the adjacent permanent magnets 38 being opposite to each other. In FIG. 4, magnetic fluxes forming the confinement magnetic fields are partly shown by arrows.

Figure 5:
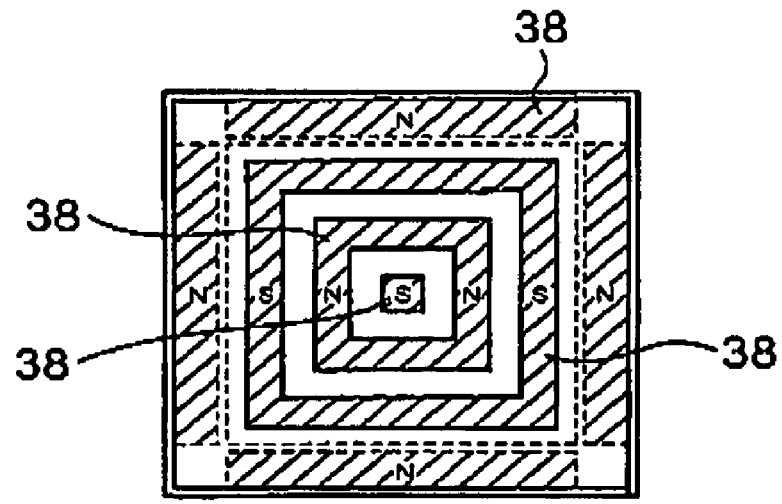
FIG. 5 is a diagram showing an arrangement of confinement magnetic field forming permanent magnets at one of both end surfaces of a second arc chamber shown in FIG. 4.

FIG. 5 shows an arrangement of the permanent magnets 38 at one of the both-side end wall surfaces of the second arc chamber 35. Herein, since the shape of the end wall surface is square, a plurality of square frame-shaped permanent magnets 38 having different sizes are disposed concentrically and a square permanent magnet 38 is disposed in the innermost-side frame-shaped permanent magnet 38. These permanent magnets 38 are also disposed with their magnetic poles directed toward the inside of the second arc chamber 35 and with the magnetic poles of the adjacent permanent magnets 38 being opposite to each other. The permanent magnet 38 may have another polygonal shape including a triangular shape. If the shape of the end wall surface is circular, the permanent magnet 38 may have an annular shape.

The first and second arc chambers 34 and 35 are supported by an arc chamber support 39. The power is supplied to the filament 31 through a filament feed 41 attached to the arc chamber support 39.

In FIGS. 2A and 2B, the charge compensation device 30 is disposed at a position where the beam is deflected slightly downward. On the other hand, in FIG. 3, the hollow cylindrical or rectangular member 40 is illustrated in the horizontal state. In order to dispose the charge compensation device 30 as shown in FIGS. 2A and 2B, the whole device is inclined so as to match a deflection angle of the beam.

Hereinbelow, the foregoing structure will be described in detail.

A gas such as Ar is introduced into the first arc chamber 34 through the gas introduction port 32. A power is supplied from a filament power supply 42 to the filament 31 disposed in the first arc chamber 34 to heat the filament 31 to a high temperature to thereby generate thermo-electrons. The thermo-electrons are accelerated by a first arc voltage supplied between the filament 31 and the first arc chamber 34 from a first arc power supply 43. The accelerated thermo-electrons collide with the introduced gas so that the first plasma is produced in the first arc chamber 34. The first arc chamber 34 is provided with one or more first extraction holes 33 and the first extraction electrode 37 is disposed on the outside thereof. By supplying a first extraction voltage between the first extraction electrode 37 and the first arc chamber 34 from a first extraction power supply 44, first electrons are extracted from the first arc chamber 34.

The second arc chamber 35 having the length corresponding to the scan area SA is introduced with a neutral gas ejected from the first extraction hole 33 without ionization in the first arc chamber 34 and with the first electrons extracted from the first arc chamber 34. Even if a material of the filament 31 should be scattered due to evaporation or the like, since the size of the first extraction hole 33 is small, the scattered material stays within the first arc chamber 34 and thus is not introduced into the second arc chamber 35.

The first electrons introduced into the second arc chamber 35 are accelerated by a second arc voltage supplied between the second arc chamber 35 and the first extraction electrode 37 from a second arc power supply 45. The accelerated electrons collide with the gas introduced from the first arc chamber 34 so that dense second plasma is produced in the second arc chamber 35.

Since the plurality of permanent magnets 38 are arranged at the wall surfaces of the second arc chamber 35 to form the confinement magnetic fields, it is possible to suppress the loss of electrons at those wall surfaces and improve the plasma uniformity in the scan direction in the second arc chamber 35.

In order to prevent thermal demagnetization of the permanent magnets 38, the second arc chamber 35 is cooled by water cooling or the like. The second arc chamber 35 is provided with the second extraction hole 36 at the position facing a beam passing region. In this embodiment, as described before, the second extraction hole 36 is in the form of the plurality of holes arranged corresponding to the scan area SA of the beam. Alternatively, the second extraction hole 36 may be realized by an opening in the form of the single slit extending over the scan area SA, which has also been described before. The second arc chamber 35 is configured so as not to allow leakage of the gas from other than the second extraction hole 36, thereby preventing a reduction in gas pressure within the second arc chamber 35 to enhance the plasma production efficiency.

When the beam passes near the second extraction hole 36, second electrons are extracted from the second arc chamber 35 by the positive potential of the beam. The extracted second electrons collide with a neutral gas ejected from the second extraction hole 36 without ionization in the first and second arc chambers 34 and 35. As a result, plasma (plasma bridge) is formed between the beam (reciprocal swinging beam) and the second arc chamber 35 (precisely the second extraction hole 36). The second electrons in the second arc chamber 35 are autonomously supplied to the beam through the plasma bridge. Since the second extraction hole 36 exists in the region corresponding to the scan area SA, even when the position of the beam moves by deflecting for scanning, the plasma bridge is constantly formed between the beam and the second arc chamber 35 to thereby achieve the autonomous electron supply. The second arc chamber 35 is configured so as to be supplied with a second extraction voltage between itself and the ground potential from a second extraction power supply 46. With this configuration, it is possible to adjust the amount and energy of electrons supplied to the beam.

The current value (arc current) between the second arc power supply 45 and the second extraction power supply 46 may be measured and fed back so as to control the power supplies to achieve a constant arc current.

The second extraction hole 36 and the scan area by the beam thereabout are covered with the hollow cylindrical or rectangular member 40. The potential of the hollow cylindrical or rectangular member 40 may be set different from that of the second arc chamber 35 to enable an adjustment of the amount of second electrons extracted from the second arc chamber 35 and supplied to the wafer or may be set equal to that of the second arc chamber 35 to achieve a simple structure.

Inner walls (surfaces in contact with the beam) of the hollow cylindrical or rectangular member 40 are formed serrated to thereby prevent adhesion of insulating stains to the whole surfaces of the inner walls. Further, on the beam upstream side of the hollow cylindrical or rectangular member 40 is disposed a bias electrode 48 that can be applied with a negative voltage from a bias power supply 47. This makes it possible to prevent scattering of electrons in the beam upstream direction and efficiently transport electrons toward the downstream side (toward the wafer). The hollow cylindrical or rectangular member 40 is further provided with magnetic shielding to thereby shield an external magnetic field, for example, a magnetic field from the angular energy filter 17. This is because when the external magnetic field is strong, electrons wind around the lines of magnetic force thereof so that the electrons are lost before reaching the wafer.

With the foregoing structure, the second extraction hole 36 exists in the region corresponding to the scan area SA. Accordingly, when the plasma is produced in the second arc chamber 35, even if the position of the beam moves by deflecting for scanning, the plasma bridge is constantly formed between the beam and the second arc chamber 35 to thereby carry out the autonomous electron supply. In addition, since the confinement magnetic fields are generated inside the second arc chamber 35, the loss of electrons at the inner wall surfaces of the second arc chamber 35 is suppressed. This makes it possible to improve the plasma production efficiency and equalize the plasma within the second arc chamber 35, thereby enabling the supply of the sufficient amount of electrons to the beam regardless of the scan position by the beam.

By the use of the charge compensation device (plasma shower) that can autonomously extract electrons by the beam potential regardless of the scan position by the beam as described above, positive charging of the wafer due to ion implantation can be suppressed.

Figure 6:
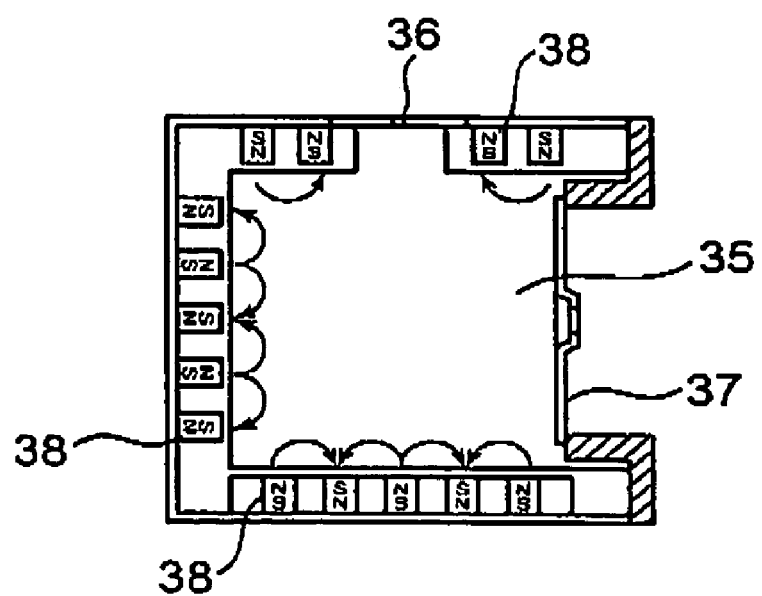
FIG. 6 is a diagram showing another arrangement of confinement magnetic field forming permanent magnets at upper, lower, left, and right wall surfaces of the second arc chamber shown in FIG. 3.

Although the description has been given about this invention in terms of the preferred embodiments, this invention is not limited thereto. For example, although the single first arc chamber 34 has been described above, the number thereof is not limited to one but a plurality of first arc chambers may be arranged at intervals in the length direction of the second arc chamber 35 as shown in FIG. 4 by a dashed line. Naturally, the first arc chambers may be provided not only at one wall of the second arc chamber 35 but also at another wall thereof. Further, the plasma forming gas may be introduced not only into the first arc chamber 34 but also into the second arc chamber 35. Further, referring to FIG. 3, for example, the permanent magnets 38 for forming the confinement magnetic fields are arranged such that the upper and lower permanent magnets 38 each extend in the beam advancing direction while the left and right permanent magnets 38 each extend in the upward/downward direction. On the other hand, as shown in FIG. 6, the upper, lower, left, and right permanent magnets 38 may be arranged such that each of them extends in a direction perpendicular to the beam advancing direction. Naturally, also in this case, the permanent magnets 38 are disposed with their magnetic poles directed toward the inside of the second arc chamber 35 and with the magnetic poles of the adjacent permanent magnets 38 being opposite to each other. With respect to both end surfaces of the second arc chamber 35, an arrangement of the permanent magnets 38 may be the same as that shown in FIG. 5.

This invention is applicable to any beam cross-sectional shape among circular, elliptical, oval, and so on.

While the present invention has thus far been described in connection with the preferred embodiment thereof, it will readily be possible for those skilled in the art to put this invention into practice in various other manners.

What is claimed is:

1. A charge compensation device for suppressing charging of a wafer, when said wafer is irradiated with a charged particle beam containing an ion beam extracted from a beam generation source unit onto the wafer, while reciprocal scanning by the reciprocal swinging beam over a predetermined scanning range on a beam line, wherein said charge compensation device comprises:

at least one first arc chamber having at least one first extraction hole which opens up in a second arc chamber; and the second arc chamber having at least one second extraction hole faced on said reciprocal swinging beam of said predetermined scan range on the beam line, a first arc voltage being applied to said first arc chamber to produce first plasma in said first arc chamber, the generated first plasma being extracted from said first arc chamber and introduced into said second arc chamber, and second plasma being produced in said second arc chamber again, and second extracted plasma from said second arc chamber forms a plasma bridge between said second extraction hole and said reciprocal swinging beam, and wherein said second arc chamber extends over said predetermined scan range and said second extraction hole is in the form of a single slit extending over said predetermined scan range or in the form of a plurality of holes arranged at intervals over said predetermined scan range.

2. A charge compensation device according to claim 1, wherein a second arc voltage is supplied between said first arc chamber and said second arc chamber for producing the second plasma in said second arc chamber.

3. A charge compensation device according to claim 2, wherein an opening shape or an opening distribution of said second extraction hole corresponds to a plasma density distribution in said second arc chamber such that an opening density becomes high at a portion where the plasma density distribution is low while the opening density becomes low at a portion where the plasma density distribution is high.

4. A charge compensation device according to claim 3, wherein even when a position of the beam changes due to reciprocating scanning by the reciprocal swinging beam, the plasma bridge is constantly formed between the reciprocal swinging beam and said second extraction hole so that an autonomous electron supply is carried out.

5. A charge compensation device according to claim 4, wherein said second arc chamber is configured so as not to allow leakage of a gas from other than said second extraction hole.

6. A charge compensation device according to claim 5, wherein said second arc chamber is provided with permanent magnets in a region other than regions where said first arc chamber and said second extraction hole are respectively provided, to form confinement magnetic fields, thereby confining the plasma in said second arc chamber to increase plasma uniformity over said predetermined scan range.

7. A charge compensation device according to claim 6, wherein a second extraction voltage is supplied to said second arc chamber for efficiently supplying the electrons to the beam.

8. A charge compensation device according to claim 7, wherein said second extraction hole and said predetermined scan range thereabout are covered with a hollow cylindrical or rectangular member.

9. A charge compensation device according to claim 8, wherein a bias electrode is provided on an upstream side, with respect to an advancing direction of the beam, of said hollow cylindrical or rectangular member to thereby prevent scattering of the electrons in an upstream direction of said hollow cylindrical or rectangular member to efficiently transport the electrons toward the wafer.

10. A charge compensation device according to claim 9, wherein a potential of said hollow cylindrical or rectangular member can be set different from that of said second arc chamber.

11. A charge compensation device according to claim 10, wherein inner walls of said hollow cylindrical or rectangular member are formed serrated to thereby prevent adhesion of insulating stains to the whole surfaces of said inner walls.

12. A charge compensation device according to claim 11, wherein an arc current is measured and fed back so that a control is executed to make constant an amount of plasma electrons in said second arc chamber or said arc current.

13. A charge compensation device according to claim 12, wherein a plurality of first arc chambers are arranged at intervals in said predetermined scan range to thereby increase the plasma density in said second arc chamber and improve the plasma uniformity in said second arc chamber.

14. A charge compensation device according to claim 13, wherein an extraction electrode is provided between said first arc chamber and said second arc chamber for extracting the electrons from said first arc chamber.

15. A charge compensation device according to claim 14, wherein a first extraction voltage is supplied between said extraction electrode and said first arc chamber for extracting the electrodes from said first arc chamber.

16. A charge compensation device according to claim 15, wherein the second arc voltage is supplied between said extraction electrode and said second arc chamber for producing the plasma in said second arc chamber.

17. A charge compensation device according to claim 16, wherein, at two end surfaces, located in a direction perpendicular to the advancing direction of the beam, of said second arc chamber, a plurality of said permanent magnets, each having a polygonal frame shape or an annular shape, are arranged concentrically for forming the confinement magnetic fields.

18. An ion implantation system comprising a scan mechanism for reciprocal scanning said wafer by the reciprocal swinging charged particle beam containing an ion beam over a predetermined scan range by the use of at least one of an electric field and a magnetic field, and an angular energy filter disposed on a downstream side of the scan mechanism for selecting only an ion species having a necessary energy from the ion beam, wherein the charge compensation device according to any one of claims 1, 2, and 3 to 17 is disposed on the downstream side of said angular energy filter.

* * * * *